(12) United States Patent
Lee et al.

(10) Patent No.: US 10,715,098 B2
(45) Date of Patent: Jul. 14, 2020

(54) ACOUSTIC RESONATOR PACKAGE

(71) Applicant: Samsung Electro-Mechanics Co., Ltd., Suwon-si (KR)

(72) Inventors: Tae Kyung Lee, Suwon-si (KR); Kwang Su Kim, Suwon-si (KR); Jin Suk Son, Suwon-si (KR); Yeong Gyu Lee, Suwon-si (KR); Sung Sun Kim, Suwon-si (KR); Sang Jin Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/271,158

(22) Filed: Feb. 8, 2019

(65) Prior Publication Data

US 2020/0021265 A1 Jan. 16, 2020

(30) Foreign Application Priority Data

Jul. 13, 2018 (KR) .................. 10-2018-0081768

(51) Int. Cl.
*H03H 9/02* (2006.01)
*H03H 9/15* (2006.01)
*H03H 9/54* (2006.01)

(52) U.S. Cl.
CPC .......... *H03H 9/02015* (2013.01); *H03H 9/15* (2013.01); *H03H 9/54* (2013.01)

(58) Field of Classification Search
CPC ............... H03H 9/02; H03H 9/15; H03H 9/54
USPC ......................................................... 333/187
See application file for complete search history.

(56) References Cited

U.S. PATENT DOCUMENTS

| 7,992,431 | B2 | 8/2011 | Shih et al. | |
|---|---|---|---|---|
| 2008/0261344 | A1* | 10/2008 | Jafri | B81C 1/00142 438/51 |
| 2011/0204753 | A1 | 8/2011 | Kikuchi et al. | |
| 2011/0260577 | A1* | 10/2011 | Kohda | H01L 21/50 310/311 |

FOREIGN PATENT DOCUMENTS

| JP | 2013-78077 A | 4/2013 |
|---|---|---|
| JP | 5398689 B2 | 1/2014 |

* cited by examiner

*Primary Examiner* — Dean O Takaoka
(74) *Attorney, Agent, or Firm* — NSIP Law

(57) ABSTRACT

An acoustic resonator package includes: a substrate; an acoustic resonator disposed on the substrate; a cap disposed on the substrate and the acoustic resonator; and a bonding portion bonding the substrate and the cap to each other, wherein the cap includes a trench formed around the bonding portion and a protective layer covering a surface of the trench in the cap, and wherein a portion of the bonding portion fills at least a portion of the trench.

17 Claims, 12 Drawing Sheets

ACOUSTIC RESONATOR PACKAGE

CROSS-REFERENCE TO RELATED APPLICATIONS

This application claims benefit under 35 U.S.C. § 119(a) of Korean Patent Application No. 10-2018-0081768 filed on Jul. 13, 2018 in the Korean Intellectual Property Office, the entire disclosure of which is incorporated herein by reference for all purposes.

BACKGROUND

1. Field

The following description relates to an acoustic resonator package.

2. Description of Related Art

Recently, in accordance with the rapid development of mobile communications devices, chemical and biological testing devices, and the like, demand for a small and light filter, an oscillator, a resonant element, an acoustic resonant mass sensor, and the like, used in such devices, has also increased.

A film bulk acoustic resonator (FBAR) is known as a member for implementing such a small and light filter, oscillator, resonant element, acoustic resonant mass sensor, and the like. An FBAR may be mass-produced at minimal cost and may be implemented to have a subminiature size. In addition, an FBAR may implement a high quality factor (Q) value, which is a main characteristic of a filter, may be used in a microwave frequency band, and may particularly implement bands of a personal communications system (PCS) and a digital cordless system (DCS).

In general, the FBAR has a structure including a resonant part implemented by sequentially stacking a first electrode, a piezoelectric layer, and a second electrode on a substrate.

An operational principle of an FBAR will hereinafter be described. First, when electrical energy is applied to first and second electrodes to induce an electric field in a piezoelectric layer, the electric field may generate a piezoelectric phenomenon in the piezoelectric layer to allow a resonant part to vibrate in a predetermined direction. As a result, a bulk acoustic wave is generated in the same direction as the direction in which the resonant part vibrates, resulting in resonance. That is, in the FBAR, which is an element using a bulk acoustic wave (BAW), an effective electromechanical coupling coefficient Kt2 of the piezoelectric body is increased, such that frequency characteristics of an acoustic wave element may be improved and an increase in band is also possible.

When an acoustic resonator such as an FBAR is packaged and used, hermeticity of a package including the acoustic resonator greatly affects reliability of the acoustic resonator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator package includes: a substrate; an acoustic resonator disposed on the substrate; a cap disposed on the substrate and the acoustic resonator; and a bonding portion bonding the substrate and the cap to each other, wherein the cap includes a trench formed around the bonding portion and a protective layer covering a surface of the trench in the cap, and wherein a portion of the bonding portion fills at least a portion of the trench.

The cap may further include a central portion accommodating the acoustic resonator, and an outer portion disposed outwardly of the central portion and connected to the bonding portion. The outer portion may have a thickness greater than a thickness of the central portion.

A ratio of a depth of the trench to a width of the trench may be in a range of 1 to 30.

The trench may be formed in the outer portion.

A difference in thicknesses between the outer portion and the central portion may be greater than a depth of the trench.

The protective layer may not be formed on regions of the outer portion other than the trench.

The protective layer may be formed on an entire surface of the cap except for a region of the surface of the cap in contact with the bonding portion.

An inner wall of the trench may have a wavy shape.

The protective layer may be a self-assembled monolayer.

The protective layer may be formed of a material including a fluorocarbon group.

The protective layer may have a thickness of 0.1 nm to 10 nm.

The protective layer may be formed of a material including a silane group.

The protective layer may have a thickness of 10 nm to 50 nm.

The bonding portion may include an alloy.

The alloy may include at least two selected from the group consisting of gold (Au), tin (Sn), copper (Cu), aluminum (Al), silicon (Si), and germanium (Ge).

The alloy may include one or more eutectic alloys selected from the group consisting of Au—Sn, Cu—Sn, and Al—Ge.

The bonding portion may further include an insulating material that is a same material as a material forming the protective layer.

Other features and aspects will be apparent from the following detailed description, the drawings, and the claims.

BRIEF DESCRIPTION OF DRAWINGS

FIGS. 4A and 4B illustrate examples of a trench and a protective layer that may be employed in the acoustic resonator package of FIG. 1, in which FIG. 4B illustrates the related art and FIG. 4B illustrates an example of the disclosure herein.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
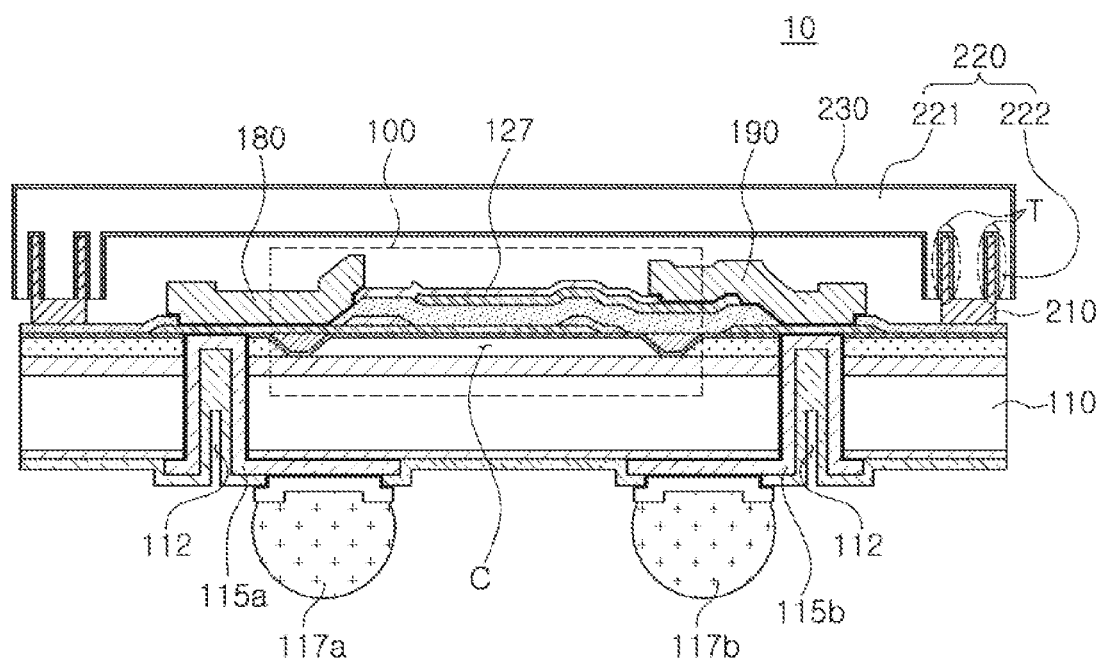
FIG. 1 is a cross-sectional view illustrating an acoustic resonator package, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
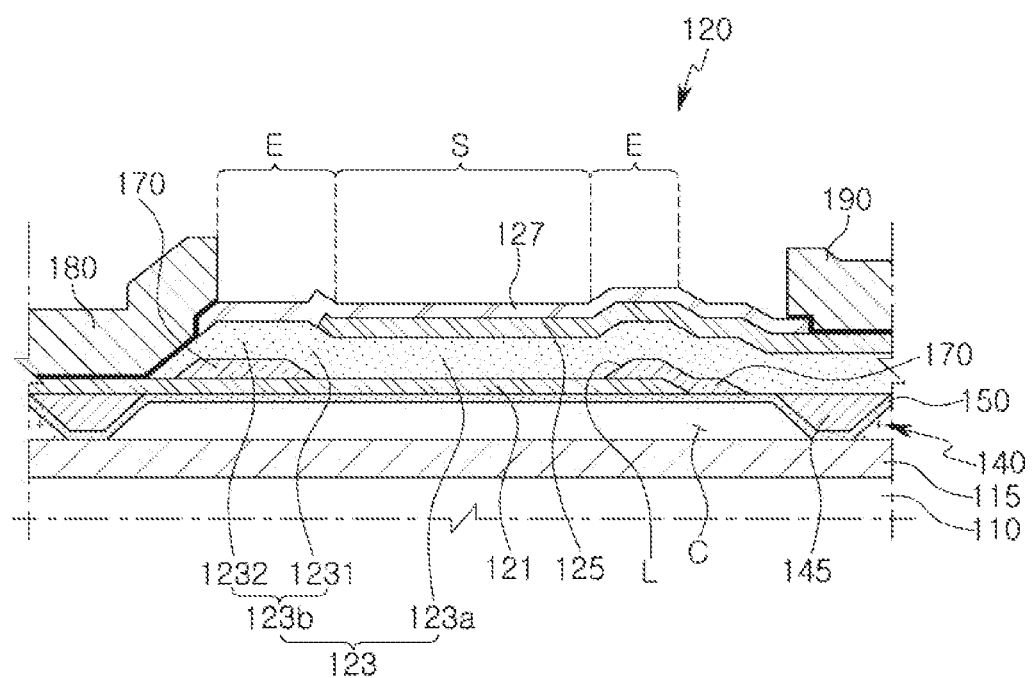
FIG. 2 is an enlarged cross-sectional view of an acoustic resonator portion in FIG. 1.
Figure 3:
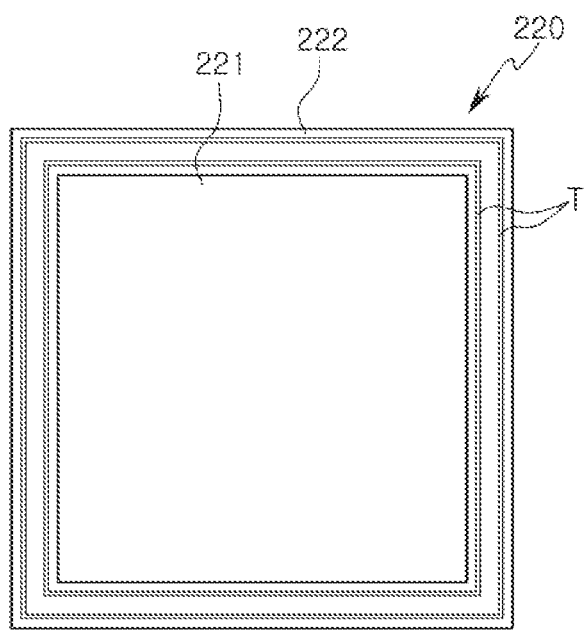
FIG. 3 is a plan view of a cap when viewed from a bottom side in FIG. 1.
Figure 4A:
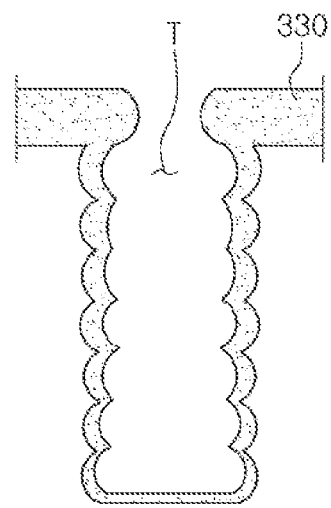
Figure 4B:
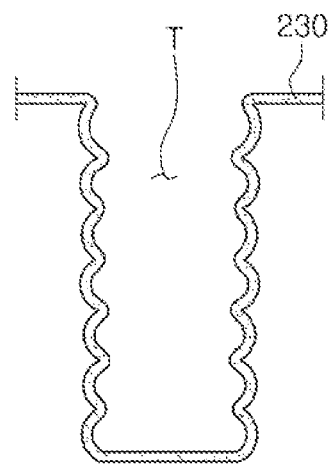

FIG. 1 is a cross-sectional view illustrating an acoustic resonator package 10, according to an embodiment. FIG. 2 is an enlarged cross-sectional view of an acoustic resonator portion in FIG. 1. FIG. 3 is a plan view of a cap 220 when viewed from a bottom side in FIG. 1. In addition, FIGS. 4A(a) and 4B) illustrate examples of a trench T and a protective layer 230 that may be employed in the acoustic resonator package 10 of FIG. 1, in which FIG. 4A illustrates the related art and FIG. 4B illustrates an example of the present disclosure.

Referring to FIGS. 1 through 4B, an acoustic resonator package may include a substrate 10, an acoustic resonator 100, a cap 220, and bonding portions 210. The cap 220 may include trenches T formed around the bonding portions 210 and a protective layer 230 covering at least a surface forming the trenches T. In addition, at least a portion of the trenches T of the cap 220 may be filled with the bonding portions 210.

Referring to FIGS. 1 and 2, the acoustic resonator 100 may be a film bulk acoustic resonator (FBAR). The film bulk acoustic resonator will hereinafter be described as an example. The acoustic resonator 100 may include a substrate 110, an insulating layer 115, a membrane layer 150, a cavity C, a resonating portion 120, and a protective layer 127.

The substrate 110 may be a silicon substrate. For example, a silicon wafer or a silicon on insulator (SOI) type substrate may be used as the substrate 110. The insulating layer 115 may be disposed on an upper surface of the substrate 110 to electrically isolate the substrate 110 and the resonating portion 120 from each other. In addition, the insulating layer 115 may prevent the substrate 110 from being etched by an etching gas at the time of forming the cavity C in a process of manufacturing the acoustic resonator. In this example, the insulating layer 115 may be formed of any one or any combination of any two or more of a silicon dioxide ($SiO_2$), a silicon nitride ($Si_3N_4$), an aluminum oxide ($Al_2O_3$), and an aluminum nitride (AlN), and may be formed on the substrate 110 by any one of a chemical vapor deposition process, a radio frequency (RF) magnetron sputtering process, and an evaporation process.

A sacrificial layer 140 may be formed on the insulating layer 115, and the cavity C and an etching preventing portion 145 may be formed in the sacrificial layer 140. The cavity C may be an empty space, and may be formed by removing a portion of the sacrificial layer 140. Since the cavity C is formed in the sacrificial layer 140, the resonating portion 120 formed on the sacrificial layer 140 may be entirely flat. The etching preventing portion 145 may be disposed along a boundary of the cavity C. The etching preventing portion 145 may be provided to prevent etching from being performed beyond a cavity region in a process of forming the cavity C. Therefore, a horizontal area of the cavity C may be defined by the etching preventing portion 145, and a vertical area of the cavity C may be defined by a thickness of the sacrificial layer 140.

The membrane layer 150 may be formed on the sacrificial layer 140 to define a thickness (or a height) of the cavity C together with the substrate 110. Therefore, the membrane layer 150 may be formed of a material that is not easily removed in the process of forming the cavity C. For example, when a halide based etching gas such as fluorine (F), chlorine (Cl), or the like, is used to remove a portion (for example, the cavity region) of the sacrificial layer 140, the membrane layer 150 may be formed of a material of which reactivity with the abovementioned etching gas is low. In this case, the membrane layer 150 may include either one or both of a silicon dioxide ($SiO_2$) and a silicon nitride ($Si_3N_4$). In addition, the membrane layer 150 may be a dielectric layer containing at least one selected from the group consisting of a manganese oxide (MnO), a magnesium oxide (MgO), a zirconium oxide ($ZrO_2$), an aluminum nitride (AlN), a lead zirconate titanate (PZT), a gallium arsenide (GaAs), a hafnium oxide ($HfO_2$), an aluminum oxide ($Al_2O_3$), a titanium oxide ($TiO_2$), and a zinc oxide (ZnO) or be a metal layer containing at least one selected from the group consisting of aluminum (Al), nickel (Ni), chromium (Cr), platinum (Pt), gallium (Ga), and hafnium (Hf). However, the configuration of the membrane layer 150 is not limited to the examples provided herein.

A seed layer (not illustrated) formed of an aluminum nitride (AlN) may be formed on the membrane layer 150. The seed layer may be disposed between the membrane layer 150 and a first electrode 121. The seed layer may be formed using a dielectric substance or a metal having a hexagonal close packed (HCP) structure, in addition to AlN. When the seed layer is formed of the metal, the seed layer may be formed of, for example, titanium (Ti). The resonating portion 120 may include the first electrode 121, a piezoelectric layer 123, and a second electrode 125. The resonating portion 120 may include the first electrode 121, the piezoelectric layer 123, and the second electrode 125 sequentially stacked from a lower portion thereof. Therefore, in the resonating portion 120, the piezoelectric layer 123 may be disposed between the first electrode 121 and the second electrode 125.

Since the resonating portion 120 is formed on the membrane layer 150, the membrane layer 150, the first electrode 121, the piezoelectric layer 123, and the second electrode 125 may be sequentially stacked on the substrate 110 to thereby form the resonating portion 120. The resonating portion 120 may resonate the piezoelectric layer 123 depending on signals applied to the first electrode 121 and the second electrode 125 to generate a resonance frequency and an anti-resonance frequency. In a case in which an insertion layer 170 (described below) is formed, the resonating portion 120 may be divided into a central portion S in which the first electrode 121, the piezoelectric layer 123, and the second electrode 125 are approximately flatly stacked and an extension portion E in which the insertion layer 170 is interposed between the first electrode 121 and the piezoelectric layer 123. The central portion S may be a region disposed at the center of the resonating portion 120, and the extension portion E may be a region disposed along a circumference of the central portion S. Therefore, the extension portion E may be a region extended outwardly from the central portion S. The insertion layer 170 may include an inclined surface L having a thickness that increases as a distance from the central portion S increases. In the extension portion E, the piezoelectric layer 123 and the second electrode 125 may be disposed on the insertion layer 170. Therefore, portions of the piezoelectric layer 123 and the second electrode 125 positioned in the extension portion E may have inclined surfaces that are inclined depending on a shape of the insertion layer 170.

In the embodiment of FIGS. 1 and 2, the extension portion E is included in the resonating portion 120, and thus, resonance may also be generated in the extension portion E. However, a position at which the resonance is generated is not limited to this example. That is, depending on a structure of the extension portion E, the resonance may not be generated in the extension portion E and may be generated in only the central portion S. The first electrode 121 and the second electrode 125 may be formed of an electric conductor, for example, of gold, molybdenum, ruthenium, iridium, aluminum, platinum, titanium, tungsten, palladium, tantalum, chromium, nickel, or a metal including any one or any combination of any two or more of gold, molybdenum, ruthenium, iridium, aluminum, platinum, titanium, tungsten, palladium, tantalum, chromium, and nickel, but is not limited to the these examples. In the resonating portion 120, the first electrode 121 may have an area greater than an area of the second electrode 125, and a first metal layer 180 may be disposed along an outer side of the first electrode 121 on the first electrode 121. Therefore, the first metal layer 180 may be disposed to surround the second electrode 125.

The first electrode 121 is disposed on the membrane layer 150, and may thus be entirely flat. The second electrode 125 is disposed on the piezoelectric layer 123, and may thus have a bend formed to correspond to a shape of the piezoelectric layer 123. The second electrode 125 may be entirely disposed in the central portion S, and may be partially disposed in the extension portion E. Therefore, the second electrode 125 may include a portion disposed on a piezoelectric portion 123a of the piezoelectric layer 123 (described below) and a portion disposed on a bent portion 123b of the piezoelectric layer 123 (described below). In more detail, the second electrode 125 may be disposed to cover the entirety of the piezoelectric portion 123 and a portion of an inclined portion 1231 of the piezoelectric layer 123. Therefore, the portion of the second electrode 125 disposed in the extension portion E may have an area smaller than an area of an inclined surface of the inclined portion 1231, and the portion of the second electrode 125 disposed in the resonating portion 120 may have an area smaller than an area of the piezoelectric layer 123.

The piezoelectric layer 123 may be formed on the first electrode 121. In a case in which an insertion layer 170 (described below) is formed, the piezoelectric layer 123 may be formed on the first electrode 121 and the insertion layer 170. A zinc oxide (ZnO), an aluminum nitride (AlN), a doped aluminum nitride, a lead zirconate titanate, quartz, or the like, may be selectively used as a material of the piezoelectric layer 123. The doped aluminum nitride may further include a rare earth metal, a transition metal, or an alkaline earth metal. As an example, the rare earth metal may include any one or any combination of any two or more of scandium (Sc), erbium (Er), yttrium (Y), and lanthanum (La), and the content of the rare earth metal may be from 1 to 20 at %. The transition metal may include at least one selected from the group consisting of hafnium (Hf), titanium (Ti), zirconium (Zr), tantalum (Ta), and niobium (Nb). In addition, the alkaline earth metal may include magnesium (Mg).

The piezoelectric layer 123 may include the piezoelectric portion 123a disposed in the central portion S and the bent portion 123b disposed in the extension portion E. The piezoelectric portion 123a may be a portion directly stacked on an upper surface of the first electrode 121. Therefore, the piezoelectric portion 123a may be interposed between the first electrode 121 and the second electrode 125 to thereby be formed to be flat together with the first electrode 121 and the second electrode 125. The bent portion 123b may be a region extended outwardly from the piezoelectric portion 123a and positioned in the extension portion E. The bent portion 123b may be disposed on an insertion layer 170, and may protrude along a shape of the insertion layer 170. Therefore, the piezoelectric layer 123 may be bent at a boundary between the piezoelectric portion 123a and the bent portion 123b, and the bent portion 123b may protrude depending on a thickness and a shape of the insertion layer 170. The bent portion 123b may include the inclined portion 1231 and an extended portion 1232. The inclined portion 1231 may be to a portion inclined along the inclined surface L of an insertion layer 170. In addition, the extended portion 1232 may refer to a portion extended outwardly from the inclined portion 1231. The inclined portion 1231 may be formed to be disposed parallel to the inclined surface L of the insertion layer 170, and an incline angle of the inclined portion 1231 may be the same as an incline angle of the inclined surface L of the insertion layer 170.

The insertion layer 170 may be disposed along a surface formed by the membrane layer 150, the first electrode 121, and the etching preventing portion 145. The insertion layer 170 may be disposed in the vicinity of the central portion S and may support the bent portion 123b of the piezoelectric layer 123. Therefore, the bent portion 123b of the piezoelectric layer 123 may include the inclined portion 1231 and the extended portion 1232 configured depending on the shape of the insertion layer 170. The insertion layer 170 may be disposed in a region excluding the central portion S. For example, the insertion layer 170 may be disposed in the entirety of the region excluding the central portion S or be disposed in a portion of the region excluding the central portion S.

In addition, at least a portion of the insertion layer 170 may be disposed between the piezoelectric layer 123 and the first electrode 121. A side surface of the insertion layer 170 disposed along a boundary of the central portion S may have a form in which a thickness of the insertion layer 170 increases as a distance from the central portion S increases. Therefore, the side surface of the insertion layer 170 disposed adjacent to the central portion S may be the inclined surface L having a predetermined incline angle. When the incline angle of the side surface of the insertion layer 170 is smaller than 5°, a thickness of the insertion layer 170 needs to be very small or an area of the inclined surface L needs to be excessively large in order to manufacture the insertion layer 170, which is substantially difficult to implement. In addition, when the incline angle of the side surface of the insertion layer 170 is greater than 70°, an incline angle of the inclined portion 1231 of the piezoelectric layer 123 stacked on the insertion layer 170 may also be greater than 70°.

In a case in which the incline angle of the side surface of the insertion layer 170 is greater than 70°, since the piezoelectric layer 123 is excessively bent, a crack may be generated in the bent portion of the piezoelectric layer 123. Therefore, in the disclosed embodiment, the inclined angle of the inclined surface L may be formed in the range of greater than or equal to 5° and less than or equal to 70°. The insertion layer 170 may be formed of a material such as silicon oxide ($SiO_2$), aluminum nitride (AlN), aluminum oxide ($Al_2O_3$), silicon nitride (SiN), manganese oxide (MnO), or zirconium oxide ($ZrO_2$), but may be formed of a material different from the material of the piezoelectric layer 123. In addition, a region in which the insertion layer 170 is provided may be an empty space, if necessary. This may be implemented by removing the insertion layer 170 after the resonating portion 120 is completely formed in a manufacturing process. The insertion layer 170 may be formed to have a thickness that is the same as or similar to a thickness of the first electrode 121. In addition, the insertion layer 170 may be formed to have a thickness that is less than a thickness of the piezoelectric layer 123. In the case in which the thickness of the insertion layer 170 is less than the thickness of the piezoelectric layer 123, the inclined portion of the piezoelectric layer 123 may be formed by the insertion layer and the crack and the like may not occur, which may contribute to improving a performance of the resonator 100. The thickness of the insertion layer 170 may not have a particular lower limit, but in order to easily adjust a deposition thickness and to secure uniformity in the thickness of a deposited wafer, the thickness of the insertion layer 170 may be 100 Å or more.

The resonating portion 120 may be disposed to be spaced apart from the substrate 110 through the cavity C that is the empty space. The cavity C may be formed by supplying an etching gas (or an etchant) to introduction holes in a process of manufacturing the acoustic resonator to remove a portion of the sacrificial layer 140. The protective layer 127 may be disposed along a surface of the acoustic resonator 100 to protect the acoustic resonator 100 from the outside. The protective layer 127 may be disposed along a surface formed by the second electrode 125, the bent portion 123b of the piezoelectric layer 123, and the insertion layer 170. The protective layer 127 may be formed of any one selected from the group consisting of a silicon oxide based insulating material, a silicon nitride based insulating material, an aluminum oxide based insulating material, and an aluminum nitride based insulating material. Also, the protective layer 127 may be additionally disposed on the substrate between the acoustic resonator 100 and the bonding portion 210.

The first electrode 121 and the second electrode 125 may be extended outwardly of the resonating portion 120, and a first metal layer 180 and a second metal layer 190 may be disposed on upper surfaces of extended portions of the first electrode 121 and the second electrode 125, respectively. The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum-germanium (Al—Ge) alloy, or the like. The first metal layer 180 and the second metal layer 190 may be configured as connection wirings electrically connecting the first and second electrodes 121 and 125 of the acoustic resonator 100 to electrodes of another acoustic resonator disposed adjacent to the acoustic resonator 100, or may be configured as external connection terminals. However, first metal layer 180 and the second metal layer 190 are not limited to the provided examples. An example in which the insertion layer 170 is removed below the second metal layer 190 is illustrated in FIG. 1, but a configuration of the acoustic resonator package 10 is not limited to this example. That is, the acoustic resonator package 10 may also be implemented in a structure in which the insertion layer 170 is disposed below the second metal layer 190, if necessary. The first metal layer 180 may penetrate through the insertion layer 170 and the protective layer 127, and may be bonded to the first electrode 121. In addition, as illustrated in FIG. 2, the first electrode 121 may be formed to have an area greater than an area of the second electrode 125, and the first metal layer 180 may be formed in a circumferential portion of the first electrode 121. Therefore, the first metal layer 180 may be disposed along a circumference of the resonating portion 120 to thus surround the second electrode 125.

As described above, the second electrode 125 may be stacked on the piezoelectric portion 123a and the inclined portion 1231 of the piezoelectric layer 123. In addition, a portion of the second electrode 125 disposed on the inclined portion 1231 of the piezoelectric layer 123, that is, the portion of the second electrode 125 disposed in the extension portion E may not be disposed on the entirety of an inclined surface of the inclined portion 1231, but may be disposed on only a portion of the inclined surface of the inclined portion 1231.

The cap 220 may be disposed on the substrate 110 and the acoustic resonator 100, and may be bonded to the substrate 110 by the bonding portion 210. The cap 220 may be configured to protect the acoustic resonator 100 from an external environment, and may be formed in a form of a cover having an internal space in which the acoustic resonator 100 is accommodated. For example, as illustrated in FIG. 1, the cap 220 may include a central portion 221 accommodating the acoustic resonator, and an outer portion 222 disposed outwardly of the central portion 221 and connected to the bonding portion 210. In this example, the outer portion 222 may have a thickness greater than a thickness of the central portion 221. A material of the cap 220 is not particularly limited, and may be, for example, a silicon wafer.

In the disclosed embodiment, the trenches T may be formed around the bonding portion 210 of the cap 220, and in this case, the trenches T may be disposed at the outer portion 222 of the cap 220 as illustrated in FIGS. 1 and 3. In a process of bonding the cap 220 to the substrate 110, the bonding portion 210 may have fluidity, and in this case, a portion of the bonding portion 210 may flow in a lateral direction to fill at least a portion of the trenches T. In the drawing, it is illustrated that the bonding portion 210 fills an overall region of the trenches T, but a portion of the trenches T may not be filled with the bonding portion 210.

Figure 9:
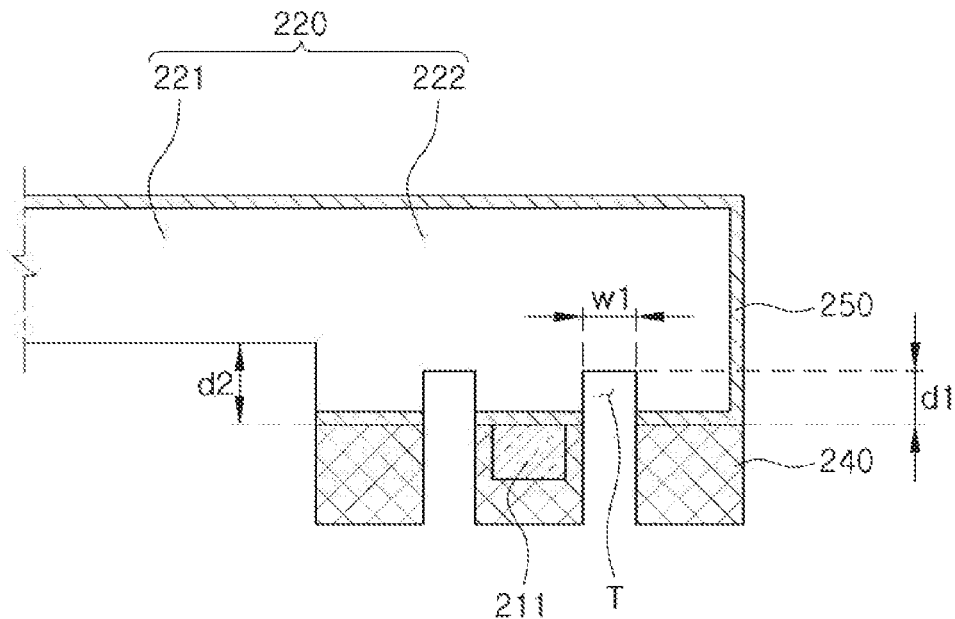

As described above, the trenches T reduce the bonding portion 210 in a flowing state that flows into a periphery of the trenches T, and may reduce an occurrence of defects due to a contact between the bonding portion 210 and the acoustic resonator 100 or the bonding portion 210 flowing out of the package 10. As illustrated in FIG. 9, a difference in thicknesses between the outer portion 222 and the central portion 221, that is, a depth d2 of the cavity formed in the central portion 221 may be greater than a depth d1 of the trench T. Such a form may be implemented in a process of forming the cavity and the trenches T of the central portion 221 by the same etching process. The depth of the trench T may vary depending on sizes of the package 10 and the cap 220, and the like, and the trench T may have the depth of about 10 to about 20 μm, for example. In addition, a ratio of the depth of the trench T to the width of the trench T, that is, an aspect ratio, may be 1 or more. In a case in which the ratio of the depth to width of the trench is 1 or less, there is a disadvantage that an area of the bonding region increases and the overall size of the device increases. In a case in which the ratio of the depth and width of the trench is 30 or more, it may be difficult to implement a shape of the trench T, and the metal material of the bonding portion may not be sufficiently filled in the trench T and it may be difficult to secure sufficient hermeticity.

The cap 220 may include the protective layer 230 covering a surface forming the trench T. The protective layer 230 may cover other surfaces of the cap 220 other than the trench T. However, the protective layer 230 may not be formed in the remaining regions of the outer portion 222 of the cap 220 except for the trench T as illustrated in FIG. 1, and such a form may be obtained in a process of stripping a photomask (PR) layer for forming the trench T, as described below. In addition, as described below with reference to FIG. 14, the protective layer 230 may not cover an outer side surface of the cap 220. The reason is because the protective layer 230 is not formed on the outer side surface of the cap 220 exposed by a dicing when the dicing is performed for each package unit after a bonding process of a wafer level.

If the bonding portion 210 were to permeate through the trench T and be in contact with the trench T, a diffusion or a chemical reaction may occur therebetween, and a defect may occur in the bonding portion 210. For example, such a defect may occur in a case in which a silicon (Si) wafer is used as the cap 220 and an Au—Sn process alloy is used as the bonding portion 210, if Si were to diffuse into the bonding portion 210 or if Au and Sn were to diffuse into the substrate 110. If such a defect were to occur as described above, since bonding force between the cap 220 and the substrate 110 would be lowered, hermeticity of the package 10 may be lowered and reliability thereof may also be lowered. Therefore, in the disclosed embodiment, the protective layer 230 is provided to cover the surface of the trench T to significantly reduce a contact between the bonding portion 210 and the cap 220 during the bonding process.

In the disclosed embodiment, the protective layer 230 may be implemented, for example, by a molecular vapor deposition process. The molecular vapor deposition process may form a molecular unit layer having a functional group that performs a function with a material having a head group that is easily adsorbed to the substrate by a vapor chemical reaction. In addition, in the protective layer 230, a conformal coating may be applied thereto and the protective layer 230 may be deposited to a side wall of the trench having a large aspect ratio at a uniform thickness, and since the protective layer 230 is deposited by the vapor chemical reaction, it may be deposited at a temperature lower than that of a deposition of a liquid chemical reaction. The protective layer 230 formed by the molecular vapor deposition process described above may be formed as a self-assembled monolayer, and the deposition process may be executed at a relatively low temperature, for example, 50° C. or less. Since the formation temperature of the trench 230 is low, the protective layer 230 may be effectively formed in a state in which the PR mask layer for trench T process is formed, and may also thinly and uniformly formed in the trench T. Since a chemic vapor deposition (CVD) process which is generally used is executed at the high temperature, the CVD process may be difficult to execute in a state in which the PR mask layer is present. In addition, the protective layer 230 may be formed to be thin and uniform in comparison to the case of using the conventional CVD process to thereby sufficiently secure a space of the trench T. For example, as illustrated in FIG. 4A, in a case in which a Si substrate is dry-etched, as the etching and passivation of Si are repeated, a scallop region of a wavy shape may occur on an inner surface of the trench (T). In a case in which a protective layer 330 is formed by using a plasma enhanced chemical vapor deposition (PECVD) process which is generally used in the related art, since it is difficult to perform the conform deposition for the protective layer 330, an entrance of the trench may be narrower. Unlike the related art, as illustrated in FIG. 4B, the protective layer 230 may be formed to have a uniform and thin thickness even when the inner surface of the trench T has a wavy shape.

Figure 5:
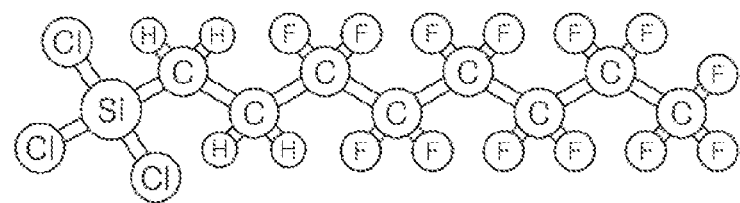
FIG. 5 illustrates a chemical bond according to an example of a hydrophobic material having a fluorocarbon group.

As an example, in which the protective layer 230 is implemented as the self-assembled monolayer, the protective layer 230 may contain a fluorine component, and may be formed of, for example, a hydrophobic material including a fluorocarbon group. In this case, the protective layer 230 may have a very thin thickness, for example, a thickness of 0.1 to 10 nm. In this example, the hydrophobic material may be defined as a material having a contact angle of 90° or more by water after deposition. FIG. 5 illustrates an example of a hydrophobic material having a fluorocarbon group by a chemical bond. In detail, the protective layer 230 may contain a fluorine (F) component, and may include fluorine (F) and silicon (Si).

Figure 6:
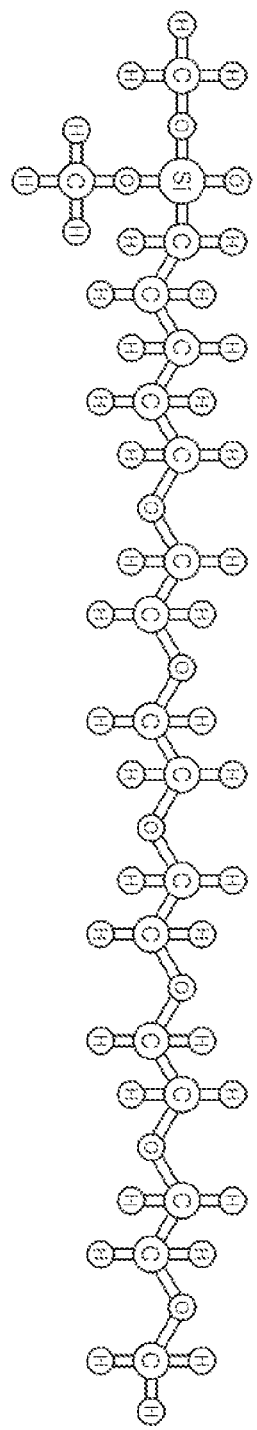
FIG. 6 illustrates a chemical bond according to an example of a material including a silane group.

As another example, the protective layer 230 may be formed of a material containing a silicon component. In detail, the protective layer 230 may be formed of a material containing a silane group, for example, siloxane. FIG. 6 illustrates a chemical bond for such a protective layer 230. In a case in which the protective layer 230 is formed of siloxane, the protective layer 230 may have the thickness greater than a thickness of the material having the fluorocarbon group. For example, the thickness of the protective layer 230 may be about 10 to about 100 nm. In a case in which the thickness of a protective layer formed of siloxane is 10 nm or less, it is difficult to effectively prevent silicon (Si) of the substrate and bonding metals such as Au, Sn, and the like from being diffused. In addition, in a case in which the thickness of a protective layer is 100 nm or more, since the deposition process is excessively performed, process efficiency may be lowered and a volume of the trench T may be reduced.

The bonding portion 210 may maintain hermeticity in the acoustic resonator package 10 by bonding the cap 220 and the substrate 110 to each other, as described above. The bonding portion 210 may include an alloy, and the alloy may include at least two selected from the group consisting of gold (Au), tin (Sn), cooper (Cu), aluminum (Al), silicon (Si), and germanium (Ge), for example, a process alloy such as Au—Sn, Cu—Sn, Al—Ge, and the like. In more detail, the bonding portion 210 may include a parent material, a melting material, and an alloy of the parent material and the melting material, which are typically used in a eutectic bonding or a metal diffusion bonding. For example, the parent material may include copper (Cu), gold (Au), silver (Ag), nickel (Ni), aluminum (Al), lead (Pb), and the like, and the melting material may include tin (Sn), indium (In), silicon (Si), zinc (Zn), germanium (Ge), and the like. In addition, an alloy of the parent material and the melting material may include $Au_3Sn$, $Cu_3Sn$, Al—Ge, and the like, but is not limited thereto.

As shown in FIG. 1, a plurality of via holes 112 penetrating through the substrate 110 may be formed in a lower surface of the substrate 110. In addition, connection conductors 115a and 115b may be formed in the respective via holes 112. The connection conductors 115a and 115b may be formed over inner surfaces, for example, entire inner walls, of the via holes 112, but are not limited to such a configuration. The connection conductors 115a and 115b may have first ends connected to external electrodes 117a and 117b formed on the lower surface of the substrate 110 and second ends electrically connected to the first electrode 121 or the second electrode 125. For example, the first connection conductor 115a may electrically connect the first electrode 121 and the external electrode 117a to each other, and the second connection conductor 115b may electrically connect the second electrode 125 and the external electrode 117b to each other. Although only two via holes 112 and two connection conductors 115a and 115b have been illustrated and described in FIG. 1, the number of via holes 112 and connection conductors 115a and 115b are not so limited, and may be larger than two, if necessary.

The acoustic resonator package ha10 may be employed to perform various functions. For example, a plurality of acoustic resonators 100 may be disposed in the acoustic resonator package 10, and in this case, depending on an arrangement of the plurality of acoustic resonators 100, a ladder type filter structure, a lattice type filter structure, or a combined filter structure of a ladder type filter structure and a lattice type filter structure may be implemented.

An example of a method of manufacturing the acoustic resonator package 10 will hereinafter be described with reference to FIGS. 7 through 14. In FIGS. 7 through 14, only the cap 220 and the substrate 110 around the bonding portion 210 are illustrated and other components are not illustrated.

Figure 7:
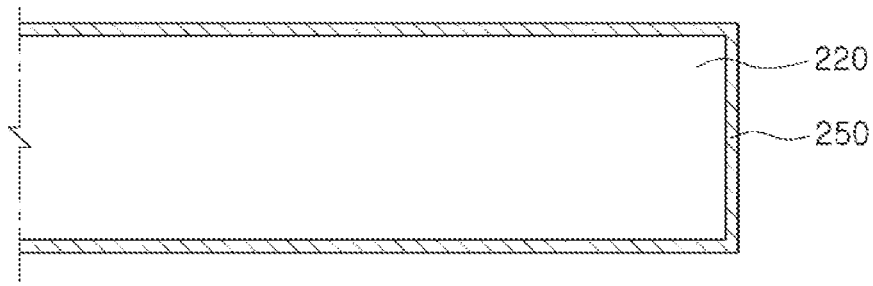
FIGS. 7 through 14 illustrate a method of manufacturing an acoustic resonator package, according to an embodiment.

First, as illustrated in FIG. 7, the cap 220 in the form of a silicon (Si) wafer or the like may be provided. In this case, a coating layer 250 protecting the cap 220 may be formed on a surface of the cap 220, and the coating layer 250 may be formed of a thermal oxide layer, a ceramic layer (e.g., AlN), or the like. However, the coating layer 250 may not be applied to the surface of the cap 220, and in this case, the cap 220 may have the same form as that described in the embodiment described above.

Figure 8:
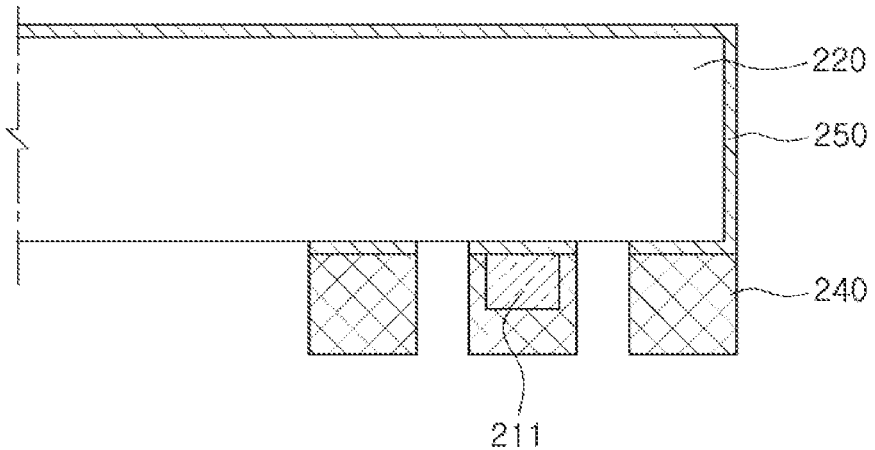

Next, as illustrated in FIG. 8, a first bonding portion 211 and a mask layer 240 may be formed on one region of the cap 220, for example, an outer portion of the cap 220. The first bonding portion 211 may be connected to a second bonding portion of the substrate 110 to form a bonded structure of the package, and may be formed of a material such as gold (Au), tin (Sn), copper (Cu), aluminum (Al), silicon (Si), germanium (Ge), and the like. As a representative example among the materials described above, the first bonding portion 211 may be formed of tin (Sn). The mask layer 240 is provided to form the cavity of the central portion and the trench in the cap and may be formed of a photoresist (PR) or the like.

Next, as illustrated in FIG. 9, the cavity and trench T may be formed by an etching process and may thus be divided into the central portion 221 and the outer portion 222. The present etching process may appropriately utilize a semiconductor etching process, and may be executed by for example, dry-etching the cap 220 of the form of a silicon wafer. In this case, as described above, the depth d2 of the cavity of the central portion 221 may be greater than the depth d1 of the trench T of the outer portion 222. In this case, as described above, a ratio of the depth d1 to the width w1 of the trench T, that is, an aspect ratio, may be in a range of 1 to 30.

As such, in the embodiment of FIGS. 7 to 14, after the first bonding portion 211 and the mask layer 240 are formed, the trench T may be formed. Conventionally, after the trench is formed through the mask layer, the first bonding portion is formed by using an additional mask layer, and in this case, it is difficult to strip the additional mask layer formed in the trench. In addition, since the protective layer is formed after the first bonding portion is formed, an additional process of removing the protective layer after the process of bonding the cap and the substrate to each other may be required.

Figure 10:
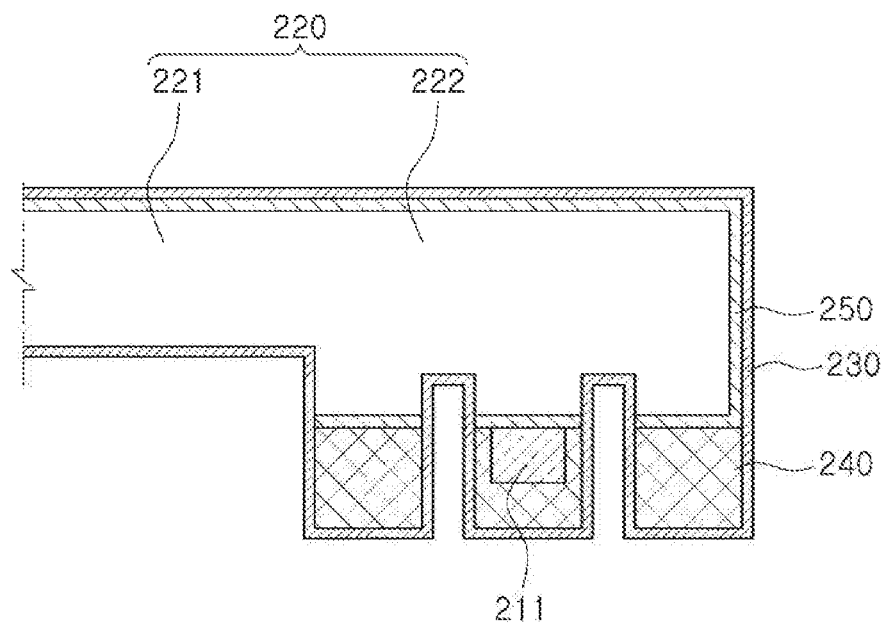
Figure 11:
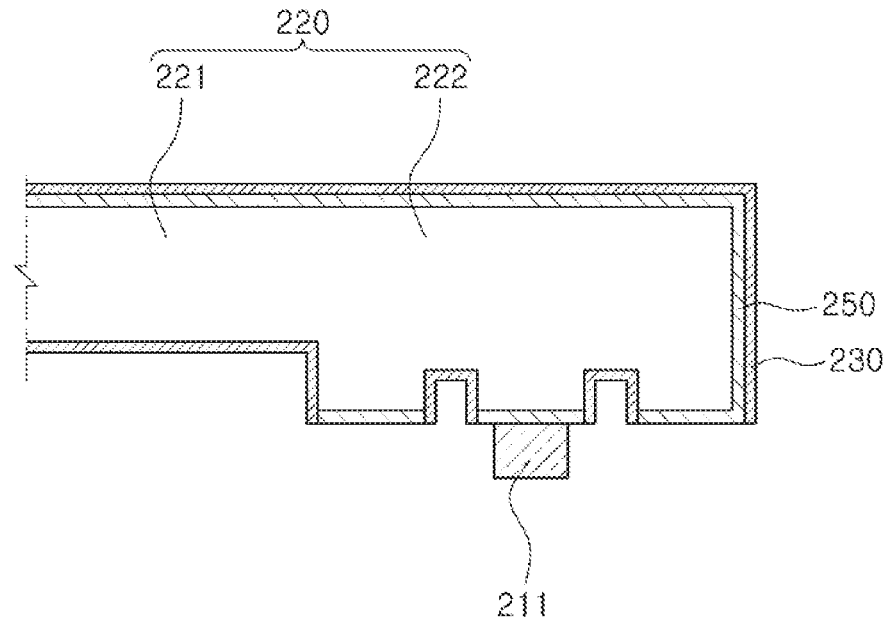

Next, as illustrated in FIG. 10, the protective layer 230 may be formed on the surface of the cap 220, and during the process of forming the protective layer 230 on the surface of the cap, the protective layer 230 may also be formed on a surface of the mask layer 240. The protective layer 230 may be formed of the self-assembled monolayer using the molecular vapor deposition process as described above and be obtained at a low temperature of 50° C. or less, and may be uniformly formed in the trench T. Thereafter, as illustrated in FIG. 11, the mask layer 240 may be removed by using a strip process or the like. Accordingly, a portion of the protective layer 230 covering the mask layer 240 may be removed, and the first bonding portion 211 may be exposed. Since the process of stripping and removing the mask layer 240 formed of the PR or the like is relatively simple and the first bonding portion 211 is exposed by such a process, an additional etching process for exposure of the first bonding portion 211 may not be required.

Figure 12:
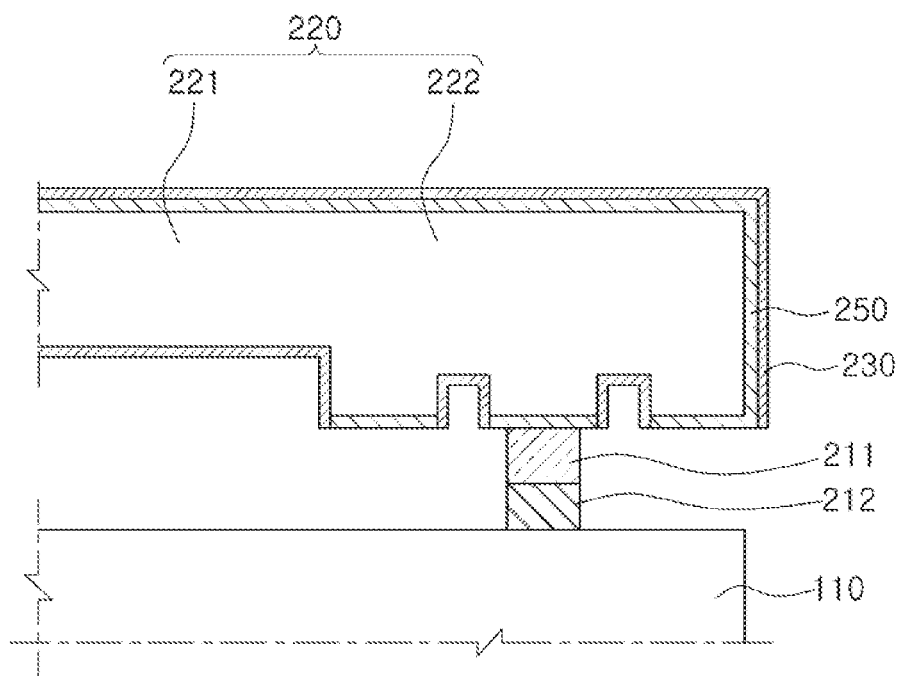
Figure 13:
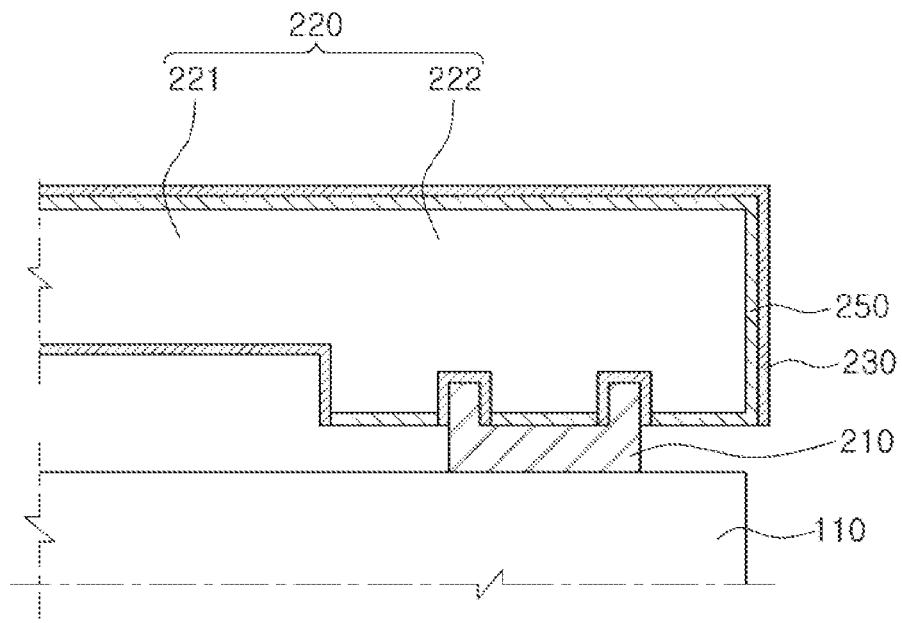

Next, as illustrated in FIG. 12, a bonding process may be performed by coupling the first bonding portion 211 of the cap 220 and the second bonding portion 212 of the substrate 110 to each other, and the bonding portion 210 as illustrated in FIG. 13 may be obtained by such a bonding process to thereby form the bonded structure of the cap 220 and the substrate 110. The second bonding portion 212 may be formed of a material such as gold (Au), tin (Sn), copper (Cu), aluminum (Al), silicon (Si), germanium (Ge), and the like, and may be formed of the same material as a material of the electrodes 121 and 125 of the acoustic resonator 100 for process efficiency. As such an example, the bonding portion 212 may include gold (Au), and may form an eutectic alloy with a tin (Sn) component of the first bonding portion 211. The bonding process of the first and second bonding portions 211 and 212 may be executed at a temperature (about 300° C.) at which the materials included in the first and second bonding portions 211 and 212, for example, tin (Sn) and gold (Au) may form an intermetalic phase. During the bonding process, the first and second bonding portions 211 and 212 may have fluidity to be spread around, and may be accommodated by the trench T so as not to flow out to the acoustic resonator 100 or the outside. In addition, the first and second bonding portions 211 and 212 may not be in direct contact with the cap 220 due to the protective layer 230 protecting the trench T, thereby maintaining hermeticity.

Figure 14:
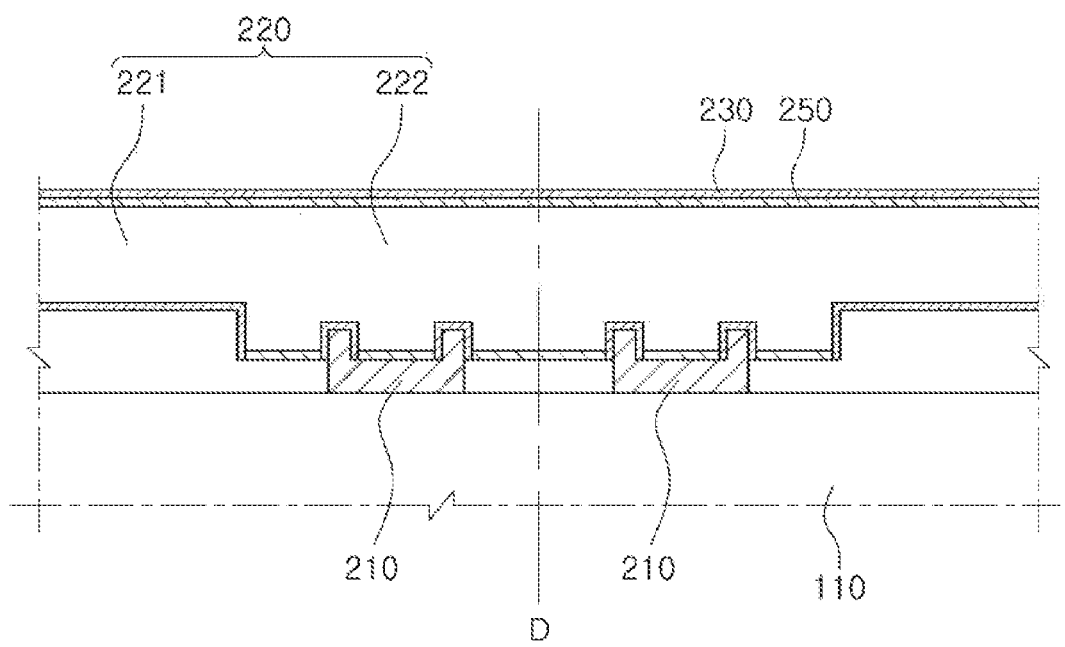

The example of the method of manufacturing the acoustic resonator package 10 described above illustrates a process of a package unit, but in order to increase efficiency, a process of a wafer level may also be used. FIG. 14 illustrates a bonding process of a wafer level in which a dicing is performed on a unit of each package in a state in which the bonding portion 120 is formed, that is, a state in which the substrate 110 and the cap 220 are bonded to each other. In this case, an outer side surface of the cap 220 may not be covered by the protective layer 230 in a region corresponding to a dicing line D. In addition, such a bonding process of the wafer level may also be applied to embodiment illustrated in FIGS. 15 through 18 to be described below.

FIGS. 15 through 18 illustrate a method of manufacturing an acoustic resonator package, according to an embodiment. As the manufacturing method is changed, a difference also occurs in the structure of the acoustic resonator package.

Figure 15:
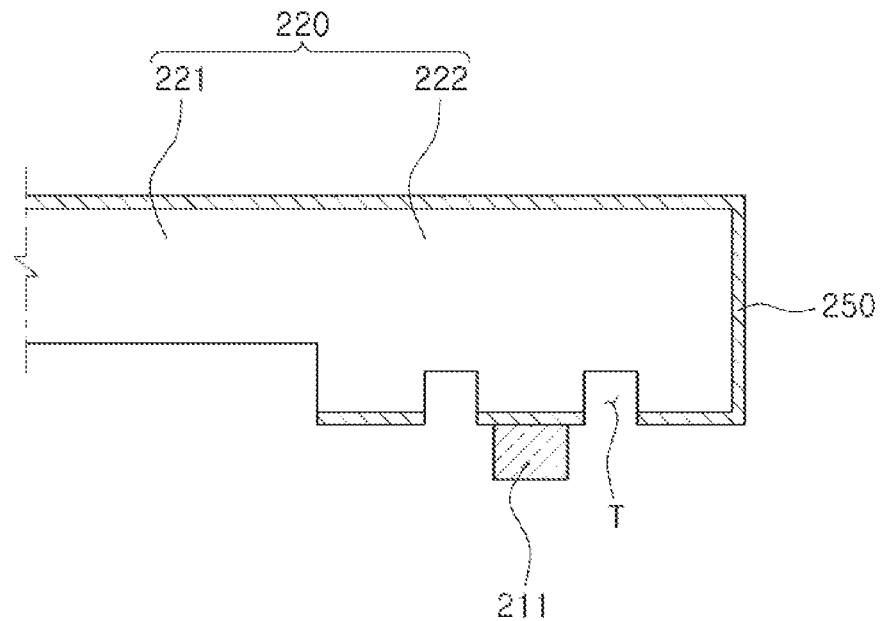
FIGS. 15 through 18 illustrate a method of manufacturing an acoustic resonator package, according to an embodiment.
Figure 16:
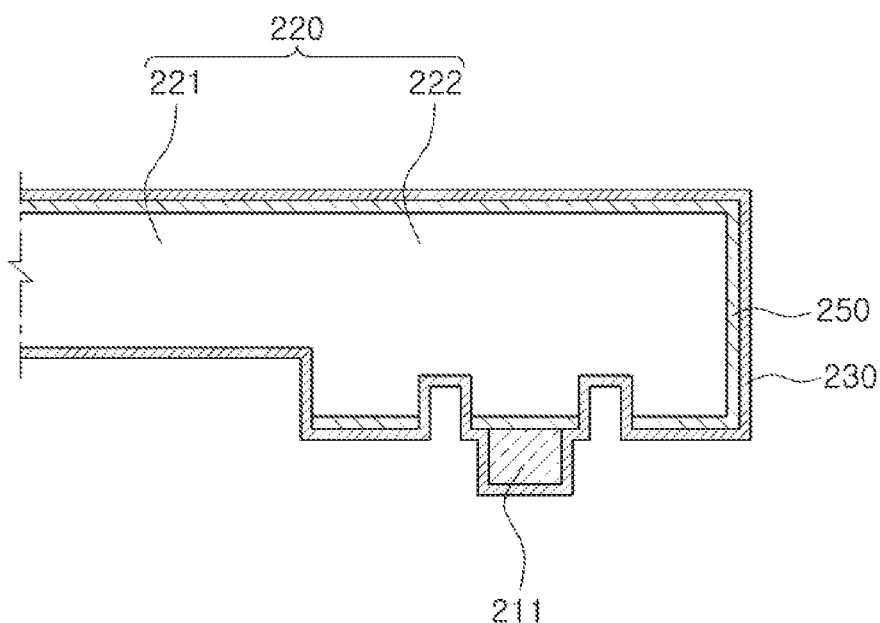
Figure 17:
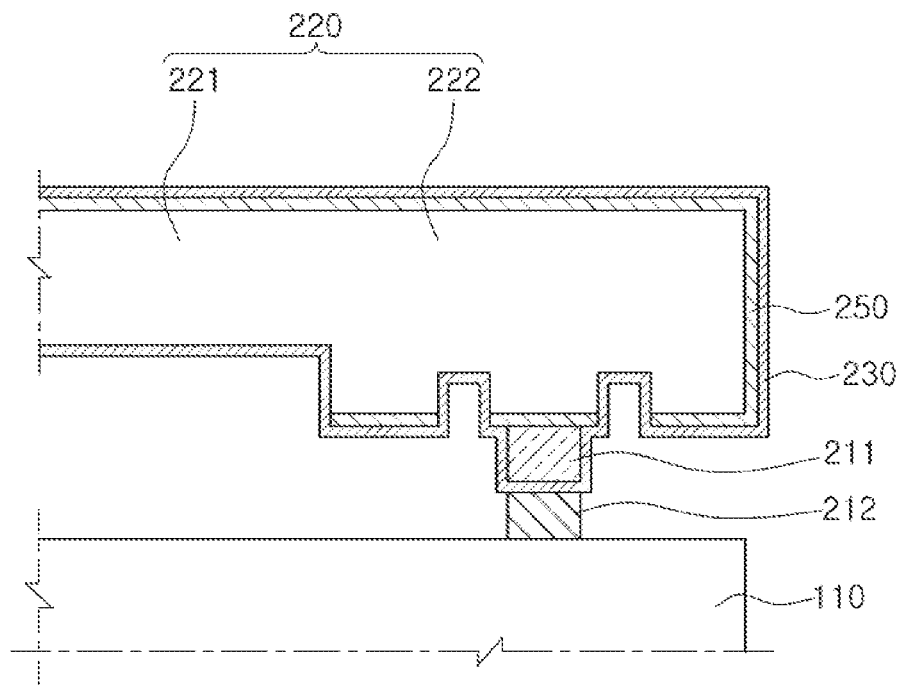
Figure 18:
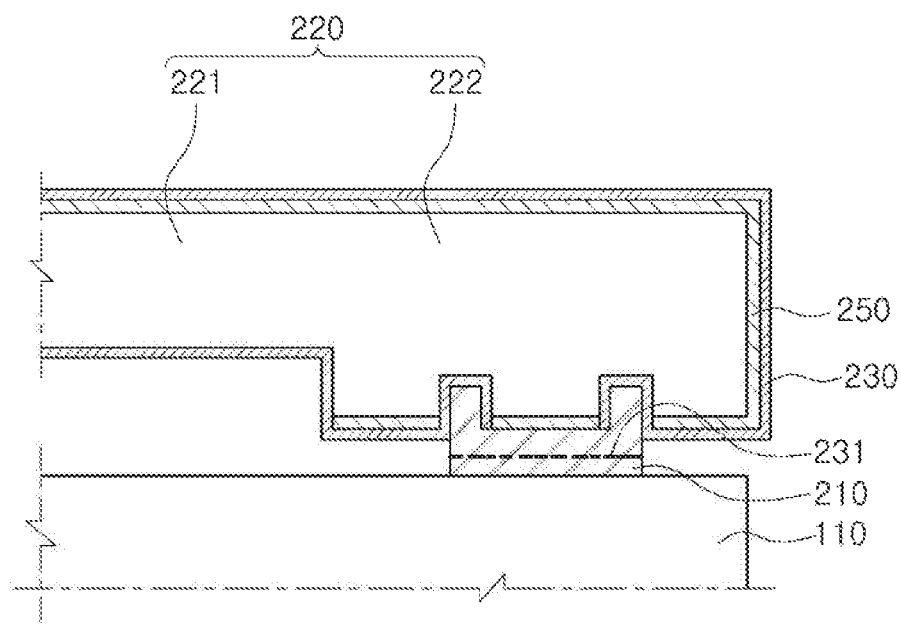

First, the form illustrated in FIG. 15 may be formed by stripping the mask layer after the process of forming the trench (corresponding to FIG. 8) of the embodiment described above with respect to FIGS. 7 to 14. In other words, in the embodiment of FIGS. 15 to 18, the protective layer 230 may be formed in state in which the mask layer is not present. Thereafter, the bonding process of FIGS. 17 and 18 may be performed, and the protective layer 230 may be interposed between the first and second bonding portions 211 and 212. Accordingly, the bonding portion 210 may further include an insulating material. Here, the insulating material may be the same as the material forming the protective layer 230. In other words, a residual component of the protective layer 230 may exist within the bonding portion 210. In addition, as illustrated in FIG. 18, the protective layer 230 may be formed on an entire surface of the cap 220 except for a region in contact with the bonding portion 210 to more effectively protect the cap 220.

As set forth above, according to embodiments disclosed herein, an acoustic resonator package may have excellent hermeticity between the substrate and the cap to thereby effectively protect an acoustic resonator accommodated therein. The acoustic resonator package described herein may significantly reduce influence from an outside environment, thereby having the improved reliability.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator package, comprising:
a substrate;
an acoustic resonator disposed on the substrate;
a cap disposed on the substrate and the acoustic resonator; and
a bonding portion bonding the substrate and the cap to each other,
wherein the cap comprises a trench formed around the bonding portion and a protective layer covering a surface of the trench in the cap, and
wherein a portion of the bonding portion fills at least a portion of the trench.

2. The acoustic resonator package of claim 1, wherein the cap further comprises a central portion accommodating the acoustic resonator, and an outer portion disposed outwardly of the central portion and connected to the bonding portion, and wherein the outer portion has a thickness greater than a thickness of the central portion.

3. The acoustic resonator package of claim 2, wherein a ratio of a depth of the trench to a width of the trench is in a range of 1 to 30.

4. The acoustic resonator package of claim 2, wherein the trench is formed in the outer portion.

5. The acoustic resonator package of claim 4, wherein a difference in thicknesses between the outer portion and the central portion is greater than a depth of the trench.

6. The acoustic resonator package of claim 4, wherein the protective layer is not formed on regions of the outer portion other than the trench.

7. The acoustic resonator package of claim 4, wherein the protective layer is formed on an entire surface of the cap except for a region of the surface of the cap in contact with the bonding portion.

8. The acoustic resonator package of claim 1, wherein an inner wall of the trench has a wavy shape.

9. The acoustic resonator package of claim 1, wherein the protective layer is a self-assembled monolayer.

10. The acoustic resonator package of claim 1, wherein the protective layer is formed of a material including a fluorocarbon group.

11. The acoustic resonator package of claim 10, wherein the protective layer has a thickness of 0.1 nm to 10 nm.

12. The acoustic resonator package of claim 1, wherein the protective layer is formed of a material including a silane group.

13. The acoustic resonator package of claim 12, wherein the protective layer has a thickness of 10 nm to 50 nm.

14. The acoustic resonator package of claim 1, wherein the bonding portion comprises an alloy.

15. The acoustic resonator package of claim 14, wherein the alloy comprises at least two selected from the group consisting of (Au), tin (Sn), aluminum (Al), silicon (Si), and germanium (Ge).

16. The acoustic resonator package of claim 15, wherein the alloy comprises one or more eutectic alloys selected from the group consisting Au-Sn, Cu-Sn, and Al-Ge.

17. The acoustic resonator package of claim 14, wherein the bonding portion further comprises an insulating material that is a same material as a material forming the protective layer.

* * * * *